(12) United States Patent
Tanaka et al.

(10) Patent No.: US 7,423,363 B2
(45) Date of Patent: Sep. 9, 2008

(54) PIEZOELECTRIC VIBRATING ELEMENT AND PIEZOELECTRIC VIBRATOR

(75) Inventors: Masako Tanaka, Okaya (JP); Shigeru Shiraishi, Ina (JP)

(73) Assignee: Seiko Epson Corporation, Tokyo (JP)

( * ) Notice: Subject to any disclaimer, the term of this patent is extended or adjusted under 35 U.S.C. 154(b) by 218 days.

(21) Appl. No.: 11/360,520

(22) Filed: Feb. 24, 2006

(65) Prior Publication Data
US 2006/0192464 A1 Aug. 31, 2006

(30) Foreign Application Priority Data
Feb. 28, 2005 (JP) ............................. 2005-052591

(51) Int. Cl.
*H01L 41/053* (2006.01)
(52) U.S. Cl. .................. 310/320; 310/348; 310/351; 310/353; 310/368
(58) Field of Classification Search ................ 310/320, 310/333, 348, 351, 353, 368, 367
See application file for complete search history.

(56) References Cited

U.S. PATENT DOCUMENTS 4,216,402 A * 8/1980 Engdahl ..................... 310/320
4,701,987 A 10/1987 Studer
5,156,460 A * 10/1992 Norling et al. ............... 374/117

FOREIGN PATENT DOCUMENTS

| JP | A-61-003514 | 1/1986 |
| JP | A 07-212171 | 8/1995 |
| JP | A 9-27729 | 1/1997 |
| JP | B2 2000-068780 | 3/2000 |

* cited by examiner

*Primary Examiner*—Darren Schuberg
*Assistant Examiner*—Derek J Rosenau
(74) *Attorney, Agent, or Firm*—Oliff & Berridge PLC

(57) ABSTRACT

A piezoelectric vibrating element includes a main vibration section vibrating in a constant direction, an open edge formed at least at one edge among edges provided in a vibration direction of the main vibration section, an outer frame section formed so as to surround the main vibration section, and a junction section being disposed between the main vibration section excluding the open edge and the outer frame section, having groove parts being recessed with respect to both surfaces of the main vibration section and flat parts being substantially flush with the both surfaces of the main vibration section, and being formed so as to integrally connect the main vibration section with the outer frame section.

11 Claims, 9 Drawing Sheets

PIEZOELECTRIC VIBRATING ELEMENT AND PIEZOELECTRIC VIBRATOR

BACKGROUND OF THE INVENTION

1. Technical Field

The present invention relates to a piezoelectric vibrating element integrally including a main vibration section and an outer frame surrounding it in the same piezoelectric substrate, and a piezoelectric vibrator.

2. Related Art

Recently, as down-sizing of electronic apparatuses has been advanced, there have been demands for miniaturizing piezoelectric vibrators used for the electronic apparatuses and piezoelectric vibrating elements used for the piezoelectric vibrators and making them thinner. To meet such demands, a piezoelectric vibrating element 500 shown in FIGS. 10A and 10B, for example, has been proposed. FIGS. 10A and 10B illustrate an AT cut vibrating element using a quartz crystal substrate as an example of related art piezoelectric vibrating elements, where FIG. 10A is a plan view and FIG. 10B is a front sectional view. As shown in FIGS. 10A and 10B, the piezoelectric vibrating element 500 includes a main vibration section 502 formed in the center portion of a quartz crystal substrate (quartz crystal wafer) 501, an outer frame section 503, and junction sections 504. The main vibration section 502 has its outer shape formed by a through-hole 505 provided in the outer peripheral portion, and is integrally connected to the outer frame section 503 by two junction sections 504 having no through-hole 505. The junction section 504 has a width of about 200 μm and is formed so that both surfaces 508 and 509 are formed to be closer to the center in the thickness direction than both surfaces 506a and 506b of the main vibration section 502 or both surfaces 507a and 507b of the outer frame section 503. Accordingly, the both surfaces 508 and 509 of the junction section 504 are connected with the both surfaces 506a and 506b of the main vibration section 502 or the both surfaces 507a and 507b of the outer frame section 503 to form steps in connecting portions. The outer frame section 503 is formed in a shape substantially surrounding the outer shape of the main vibration section 502 (e.g., JP-A-7-212171, an example of related art). Although not shown in the drawing, a piezoelectric vibrating element including the main vibration section and the outer frame section connected with each other by using four junction sections is also disclosed (e.g., Japanese Patent No. 3,390, 348, another example of related art).

As described above, however, the junction section 504 has a small thickness and a small width, and therefore the strength of the junction is not sufficient such that the junction section 504 is easy to break upon impact such as, for example, if the junction section 504 is dropped. Since the junction section 504 is formed to have steps in the connecting portions of both surfaces 508 and 509 with both surfaces 506a and 506b of the main vibration section 502 or both surfaces 507a and 507b of the outer frame section 503, stress concentration occurs at corner portions to facilitate breakage of the junction section 504 when an impact such as dropping or the like is imposed. The breakage of the junction section 504 causes the main vibration section 502 to be detached from the outer frame section 503, resulting in a problem that it becomes impossible for the piezoelectric vibrating element 500 to fulfill its function.

SUMMARY

An advantage of the invention is to provide a piezoelectric vibrating element with improved impact resistance such that the junction section can be prevented from breakage caused by an impact such as dropping or the like, and a piezoelectric vibrator.

A piezoelectric vibrating element according to an aspect of the invention includes a main vibration section vibrating in a constant direction, an open edge formed at least at one edge among edges provided in a vibration direction of the main vibration section, an outer frame section formed so as to surround the main vibration section, and a junction section being disposed between the main vibration section excluding the open edge and the outer frame section, having groove parts being recessed with respect to both surfaces of the main vibration section and flat parts being substantially flush with the both surfaces of the main vibration section, and being formed so as to integrally connect the main vibration section with the outer frame section.

In the piezoelectric vibrating element according to an aspect of the invention, the junction section includes the groove parts that are recessed from the both surfaces of the main vibration section and the flat parts that are flush with the both surfaces of the main vibration section. Thus, by providing the junction section with the flat parts that are flush with the both surfaces of the main vibration section, stress concentration caused by an impact or the like can be prevented in portions where the flat parts are provided. Moreover, since the groove parts in the recessed shape prevent vibrations of the main vibration section from leaking to the outer frame section due to their recessed shapes, an increase in the width of the junction section has a small influence on the vibration characteristics. For this reason, it is possible to increase the width. Accordingly, by forming the junction section to be composed of the groove parts in the recessed shape and the flat parts that are flush with both surfaces of the main vibration section, the strength of the junction section can be enhanced and the junction section can be prevented from breakdown due to an impact from the outside or the like. Since an open edge is provided at least at one end in the vibration direction of the main vibration section, expansion and contraction due to temperature change of the main vibration section can be absorbed at the open edge. This enables stable vibration of the main vibration section even if temperature change occurs. Consequently, it is possible to provide a piezoelectric vibrating element that has improved impact resistance and further can vibrate stably against temperature change.

Preferably the open edges are formed at both ends in the vibration direction of the main vibration section.

In this manner, expansion and contraction due to temperature change of the main vibration section and the outer frame section can be absorbed at both ends in the vibration direction. This enables relaxation of stress applied to the main vibration section, leading to further reduction of the influence on the vibration characteristics.

The open edge may extend to part of an edge of the main vibration section in the direction crossing the vibration direction of the main vibration section.

Preferably the junction section is formed to have a length equal to or greater than one-half the length in the vibration direction of the main vibration section.

In this manner, deterioration in vibration characteristics that is caused by propagation of the vibration of the main vibration section through the junction section to the outer frame section can be limited to the allowable range.

Preferably both surfaces of the outer frame section are formed outside of both surfaces of the main vibration section, in the thickness direction.

In this manner, the both surfaces of sections other than the outer frame section are formed to be closer to the center of the piezoelectric vibrating element in the thickness direction than the both surfaces of the outer frame section. Therefore, if, for example, the piezoelectric vibrating element is placed on a plate, the outer frame section comes in contact with the plate and portions other than the outer frame section be never affected by the contact. In other words, it becomes possible to provide a piezoelectric vibrating element having stable vibration characteristics such that fixing the outer frame section has no influence on other portions.

A piezoelectric vibrator according to another aspect of the invention includes a main vibration section vibrating in a constant direction, an open edge formed at least at one edge in the vibration direction of the main vibration section, an outer frame section formed so as to surround the main vibration section, a junction section being disposed between the main vibration section excluding the open edge and the outer frame section, having groove parts being recessed with respect to both surfaces of the main vibration section and flat parts being substantially flush with the both surfaces of the main vibration section, and being formed so as to integrally connect the main vibration section with the outer frame section, and a cover containing at least the main vibration section and being fixed to the outer frame section.

In the piezoelectric vibrator according to another aspect of the invention, the junction section includes the groove parts that are recessed from the both surfaces of the main vibration section and the flat parts that are flush with the both surfaces of the main vibration section. Thus, by providing the junction section with the flat parts that are flush with the both surfaces of the main vibration section, stress concentration caused by an impact or the like can be prevented in portions where the flat parts are provided. Moreover, since the groove parts in the recessed shape prevent vibrations of the main vibration section from leaking to the outer frame section due to their recessed shapes, an increase in the width of the junction section has a small influence on the vibration characteristics. For this reason, it is possible to increase the width. Accordingly, by forming the junction section to be composed of the groove parts in the recessed shape and the flat parts that are flush with the both surfaces of the main vibration section, the strength of the junction section can be enhanced and the junction section can be prevented from breakdown due to an impact from the outside or the like. Since an open edge is provided at least at one end in the vibration direction of the main vibration section, expansion and contraction due to temperature change of the main vibration section can be absorbed at the open edge. This enables stable vibration of the main vibration section even if temperature change occurs. Thus, even if temperature change occurs, the deformation amount due to difference in coefficient of thermal expansion between a cover fixed to the outer frame section and the main vibration section is absorbed, thereby enabling stable vibrations of the main vibration section. Consequently, it becomes possible to provide a piezoelectric vibrator that has the improved impact resistance and further can vibrate stably against temperature change.

Preferably the open edges are formed at both ends in the vibration direction of the main vibration section.

In this manner, expansion and contraction due to temperature change of the main vibration section and the outer frame section can be absorbed at both ends in the vibration direction. This enables relaxation of the stress applied to the main vibration section, thereby further reducing the influence on the vibration characteristics. Accordingly, a piezoelectric vibrator in which fixing a cover to the outer frame section has a small influence on the vibration characteristics can be provided.

The open edge may extend to part of an edge of the main vibration section in the direction crossing the vibration direction of the main vibration section.

Preferably the junction section is formed to nave a length equal to or greater than one-half the length in the vibration direction of the main vibration section.

In this manner, the width of the piezoelectric vibrating element in the area of one-half the length of the main vibration section or more can be increased. The increase of the width causes a higher order vibration in the contour vibration mode, which is a spurious vibration mode, to become near the main vibration. The vibration strength of the contour vibration mode is decreased. That is, this allows the influence of the contour vibration mode on the main vibration to be reduced and the stable vibration characteristics to be obtained. As a result, it becomes possible to provide a piezoelectric vibrator having stable vibration characteristics.

Preferably the both surfaces of the outer frame section is formed outside the both surfaces of sections other than the outer frame section in the thickness direction.

In this manner, the both surfaces of sections other than the outer frame section are placed to be closer to the center of the piezoelectric vibrating element in the thickness direction than the both surfaces of the outer frame section. Therefore, if a cover is fixed to the outer frame section, portions other than the outer frame section are in midair to be prevented from coming in contact with the cover. Thus, it becomes possible to provide a piezoelectric vibrator having stable vibration characteristics.

Preferably the cover is fixed through a frame formed in a constant thickness substantially along the outer frame section to the outer frame section.

In this manner, the main vibration section and other portions are prevented from coming in contact with the cover, and thus it becomes possible to provide a piezoelectric vibrator having stable vibration characteristics.

BRIEF DESCRIPTION OF THE DRAWINGS

The invention will be described with reference to the accompanying drawings, wherein like numbers refer to like elements.

FIG. 1A is a perspective view, FIG. 1B is a plan view, and FIG. 1C is a front sectional view.

FIG. 3A is a plan view, and FIG. 3B is a front sectional view.

FIG. 4A is a plan view, and FIG. 4B is a front sectional view.

FIG. 6A is a plan view and FIG. 6B is a front sectional view.

FIG. 10A is a plan view and FIG. 10B is a front sectional view.

DESCRIPTION OF THE EMBODIMENTS

Preferred embodiments of a piezoelectric vibrating element and a piezoelectric vibrator of the invention will now be described with reference to the accompanying drawings.

A piezoelectric vibrating element utilizes various piezoelectric materials including quartz crystal. Quartz crystal having crystal axes, that is, the X axis (electrical axis), the Y axis (mechanical axis), and the Z axis (optical axis) is an example of the piezoelectric materials. A quartz crystal vibrating element is formed using a quartz crystal substrate that is made by cutting out a piece from this quartz crystal and functions as a piezoelectric substrate. One example of this quartz crystal substrate is what has been referred to as an AT cut quartz crystal substrate. The AT cut quartz crystal substrate is cut with one side parallel to the X axis and the other side parallel to the Z' axis, which is inclined at approximately 35° to the Z axis around the X axis. Regarding a piezoelectric vibrating element mentioned in the embodiment below, description will be given for an example using the AT cut quartz crystal substrate. The piezoelectric vibrating element is not limited to the AT cut quartz crystal substrate, and may be a quartz crystal substrate cut at a different angle or a piezoelectric vibrating element using another piezoelectric material. In this case, if the piezoelectric vibrating element has the same structure as in the embodiment described below, it has the same effects.

First Embodiment

Figure 1A:
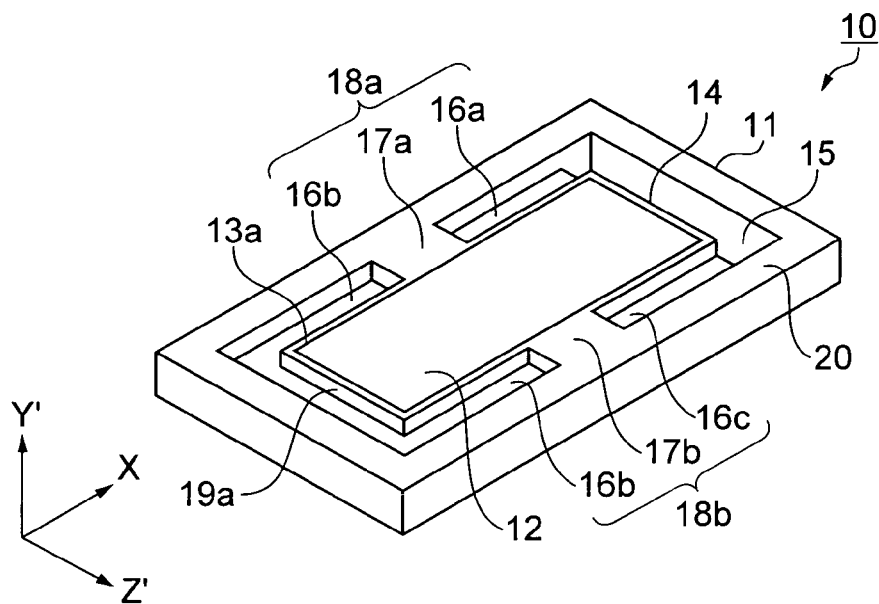
FIGS. 1A, 1B, and 1C illustrate the schematic structure of a piezoelectric vibrating element of a first embodiment, where
Figure 1B:
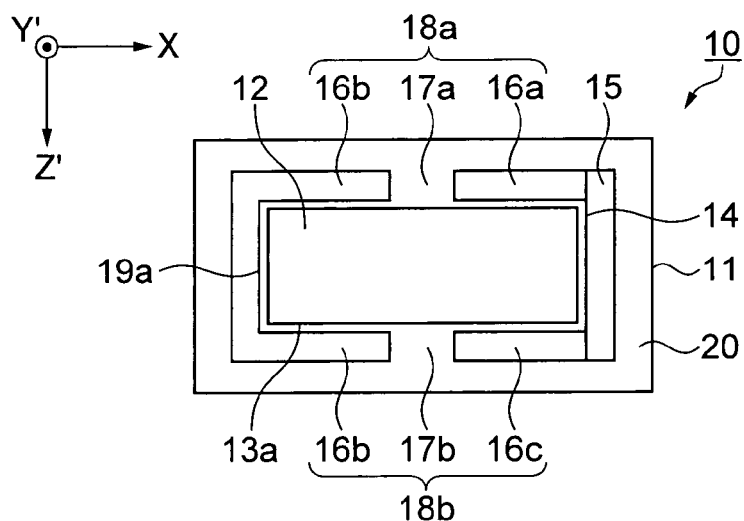
Figure 1C:
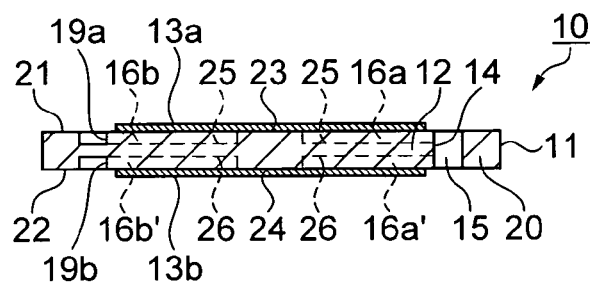

A first embodiment of a piezoelectric vibrating element of the invention will be described with reference to the accompanying drawings. FIGS. 1A, 1B, and 1C illustrate the schematic structure of a piezoelectric vibrating element of the first embodiment, where FIG. 1A is a perspective view, FIG. 1B is a plan view, and FIG. 1C is a front sectional view.

As shown in FIGS. 1A, 1B, and 1C, a quartz crystal vibrating element 10 as an example of the piezoelectric vibrating element is made from a quartz crystal substrate 11. The quartz crystal vibrating element 10 includes a main vibration section 12, excitation electrodes 13a and 13b made on both surfaces 23 and 24 of the main vibration section 12, an outer frame section 20 disposed substantially along the outside of the main vibration section 12, and junction sections 18a and 18b connecting the main vibration section 12 with the outer frame section 20.

The main vibration section 12 has a rectangular shape in which its four edges (four sides) are defined by the junction sections 18a and 18b and a through hole 15 that are disposed in the periphery. In the main vibration section 12, a thickness shear vibration that vibrates using the X axis direction as the vibration direction (hereinafter the vibration direction is referred to as the X direction) is excited by applying a voltage to the excitation electrodes 13a and 13b formed on the both surfaces 23 and 24. One edge in the X axis direction of the main vibration section 12 is an open edge 14 made by the through hole 15. The other edges of the main vibration section 12 are connected to the junction sections 18a and 18b. In portions of the other edges connected to groove parts 16a, 16b, and 16c, edge surfaces 19a and 19b having depths equivalent to those of recessed shapes of the groove parts 16a, 16b, and 16c are formed. The same groove parts 16a' and 16b' as at the front surface are formed at the back surface of the quartz crystal substrate 11.

The junction sections 18a and 18b include the groove parts 16a, 16b, and 16c with bottom surfaces 25 and 26 formed in a recessed shape, and flat parts 17a and 17b flush with the both surfaces 23 and 24 of the main vibration section 12 and both surfaces 21 and 22 of the outer frame section 20. The flat parts 17a and 17b are provided approximately at the centers of two sides along the X axis direction of the main vibration section 12. The groove parts 16a, 16b, and 16c have depths of some μm (e.g., 2 μm), and are connected to the flat parts 17a and 17b to extend in the X axis direction of the main vibration section 12. Among the groove parts 16a, 16b, and 16c, the groove parts 16a and 16c provided at the side of the through hole 15 are disposed between the flat parts 17a and 17b and the through hole 15. The groove 16b provided at the opposite side of the through hole 15 extends from the flat part 17a, curves from the X axis direction to the Z' axis along the outer periphery of the main vibration section 12, returns to the X axis direction, and is connected to the flat part 17b.

The groove parts 16a, 16b, and 16c are used for enlarging the shapes of the junction sections 18a and 18b to improve the strength while preventing deterioration in vibration characteristics caused by propagation of the vibration of the main vibration section 12 to the outer frame section 20. Here, explanation will be given on propagation of the vibration of the AT cut quartz crystal vibrating element 10.

Regarding a thickness shear vibration that is the main vibration of an AT cut quartz crystal vibrating element 10, although placement of excitation electrodes and the like is decided so that the center portion of the vibrating element vibrates, the thickness shear vibration that occurs in the center portion is propagated to the outer peripheral portion (the outer frame section 20 in this embodiment) of the vibrating element.

The quartz crystal vibrating element 10 is often held by fixing the outer frame section 20 to a holder, and the vibration propagated to the outer frame section 20 is suppressed by the fixing. This suppression of the propagated vibration has an effect on the thickness shear vibration, which is the main vibration. As a result, the crystal impedance (CI value) decreases and other vibration modes are induced to decrease the stability of oscillation frequency.

The propagation of vibration is given by Eqs. (1) to (4). According to Eqs. (1) to (4), if there are areas having different frequencies in the same vibrating element, the vibration is propagated from an area with a high frequency to an area with a low frequency, whereas, from the area with a low frequency to the area with a high frequency, the vibration is damped in accordance with the propagation distance because $\alpha$ and $\beta$ are imaginary numbers.

As described above, formation of the groove parts 16a, 16b, and 16c increases the connection area of the junction sections 18a and 18b while suppressing the propagation of thickness shear vibration to the outer frame section 20, and thereby the strength of the junction sections 18a and 18b can be improved.

Equation (1)

$$\bigcup = B \cdot \exp\left[-j(\omega t - (\alpha x + \beta z))\right] \quad (1)$$

Equation (2)

$$\alpha x = \left(\frac{\pi x}{2b}\right)\left(\frac{\gamma_{11}}{C_{66}} + \frac{\pi^2}{12}\right)^{-\frac{1}{2}}\left[\left(\frac{\omega}{\omega_s}\right)^2 - 1\right]^{\frac{1}{2}} \quad (2)$$

Equation (3)

$$\gamma_{11} = \frac{s_{33}}{s_{11}s_{33} - s_{13}^2} \quad (3)$$

Equation (4)

$$\beta z = \left(\frac{\pi z}{2b}\right)\left(\frac{C_{66}}{C_{55}}\right)^{\frac{1}{2}}\left[\left(\frac{\omega}{\omega_s}\right)^2 - 1\right]^{\frac{1}{2}} \quad (4)$$

U: displacement of a thickness shear vibration to the X and Z directions; B: amplitude; $\omega$, $\omega_s$: angular frequencies of a vibrator and a vibrating element, respectively; $\alpha$, $\beta$: propagation constants in the X and Z directions, respectively; $C_{55}$, $C_{66}$: elastic stiffnesses; $S_{11}$, $S_{13}$, $S_{33}$: elastic compliances; 2a: length in the X axis direction of the main vibration section; 2b: thickness of the main vibration section; 2c: width in the Z' direction of the main vibration section In the outer frame section 20, the quartz crystal vibrating element 10 is connected with a holder of another circuit board or the like (not shown) or with a cover (not shown) to protect the main vibration section 12. The outer frame section 20 and the main vibration section 12 are integrally connected with each other through the junction sections 18a and 18b on the quartz crystal substrate 11.

Figure 2:
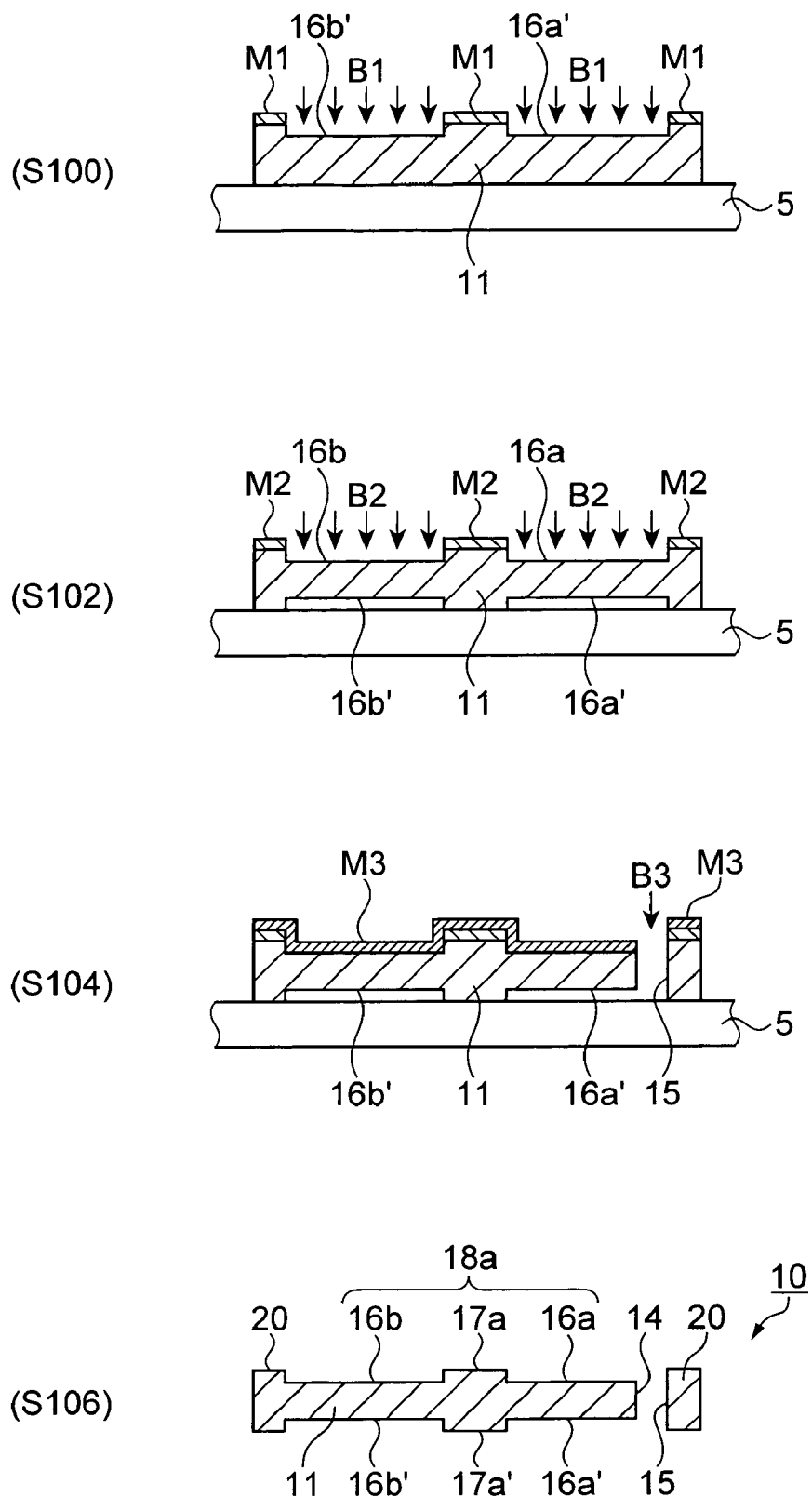
FIG. 2 is a process diagram for illustrating a manufacturing method of a piezoelectric vibrating element of the first embodiment.

A method of manufacturing the quartz crystal vibrating element 10 will next be described with reference to FIG. 2. FIG. 2 is a process diagram for illustrating a manufacturing method of a piezoelectric vibrating element of the first embodiment.

A first mask pattern M1 corresponding to the shape of the quartz crystal vibrating element 10 is initially formed on the front surface of the quartz crystal substrate 11 (quartz crystal wafer) used as an example of the piezoelectric substrate. Mask patterns that can withstand blast processing to be described later are sufficient for the first mask pattern M1. For example, a dry film resist is only needed to be attached onto the quartz crystal substrate 11 and then exposed and developed in correspondence to the shape of the quartz crystal vibrating element 10, thereby forming the first mask pattern M1 on a portion of the dry film resist that corresponds to the shape of the quartz crystal vibrating element 10. Depending on embodiments, a photoresist may be applied onto the quartz crystal substrate 11 and then exposed and developed in correspondence to the shape of the quartz crystal vibrating element 10, thereby forming the first mask pattern M1 on a portion of the photoresist that corresponds to the shape of the quartz crystal vibrating element 10. A film made of metal or the like in correspondence to the shape of the quartz crystal vibrating element 10 may also be used as the first mask pattern M1. The quartz crystal substrate 11 having the first mask pattern M1 formed thereon is fixed to a table 5 with the front surface facing upward. As indicated by arrow B1, an abrasive as well as pressurized gas are blasted from a blast device (not shown) to the quartz crystal substrate 11 to halfway remove portions of the quartz crystal substrate 11 on which the first mask pattern M1 is not formed, and thereby the groove parts 16a' and 16b' in the recessed shape are formed (S100). Openings of the groove parts 16a' and 16b' are not limited to ones having the sides perpendicular to the front surface of the quartz crystal substrate 11, and may be a tapered shape that is wide at the front surface and is narrow at the center side of the quartz crystal substrate 11.

After the first mask pattern M1 is removed, a second mask pattern M2 is formed on the back surface of the quartz crystal substrate 11. The second mask pattern M2 is provided on the back surface of the quartz crystal substrate 11 corresponding to the shape of the quartz crystal vibrating element 10, and is only needed to be formed in the same manner as the first mask pattern M1. The quartz crystal substrate 11 having the second mask pattern M2 formed thereon is fixed to the table 5 with its back surface facing upward. As indicated by arrow B2, an abrasive as well as pressurized gas are blasted from a blast device (not shown) to the quartz crystal substrate 11 to halfway remove portions of the quartz crystal substrate 11 on which the second mask pattern M2 is not formed, and thereby the groove parts 16a and 16b in the recessed shape are formed (S102).

The through hole 15 is next formed. The through hole 15 is provided so as to form an open edge of the main vibration section of the quartz crystal vibrating element 10. A third mask pattern M3 excluding a portion corresponding to the through hole 15 is formed on the second mask pattern M2 at the back surface of the quartz crystal substrate 11 and on a crystal surface of exposed grooves 16a and 16b. The third mask pattern M3 is formed on the surface of the second mask pattern M2 without removing the second mask pattern M2 in this example, but may be formed on the crystal surface at the back surface of the quartz crystal substrate 11 after the second mask pattern M2 is removed. The quartz crystal substrate 11 having the third mask pattern M3 formed thereon is fixed to the table 5 with the third mask pattern M3 facing upward. As indicated by arrow B3, an abrasive as well as pressurized gas are blasted from a blast device (not shown) to the quartz crystal substrate 11 to remove a portion without the third mask pattern M3 of the quartz crystal substrate 11 so that a hole passes completely through to the groove 16a' explained in step S100, and thereby the through hole 15 is formed (S104).

The quartz crystal substrate 11 is then detached from the fixing plate 5, and the third mask pattern M3 and the second mask pattern M2 are removed (S106). Thus, the junction section 18a including the grooves 16a, 16b, 16a', and 16b' and the flat parts 17a and 17a' are formed in the quartz crystal substrate 11. Although not shown in FIG. 2, the junction section 18b shown in FIGS. 1A, 1B, and 1C is formed at the same time as the junction section 18a. As a result, the outer shape of the quartz crystal vibrating element 10 including the outer frame section 20 and the main vibration section (not shown in FIG. 2) substantially surrounded by the junction sections 18a and 18b and the through hole 15 is formed. Although the description with reference to FIG. 2 has been given using the grooves 16a, 16b, 16a', and 16b' of one junction section 18a that are formed at the both surfaces of the substrate, the other junction section 18b also has grooves formed at the both surfaces of the substrate.

Thereafter, although not shown in FIG. 2, formation of electrodes such as the excitation electrodes (13a and 13b in FIGS. 1A, 1B, and 1C) to be formed on the both surfaces (23 and 24 in FIGS. 1A, 1B, and 1C) of the main vibration section (12 in FIGS. 1A, 1B, and 1C) of the quartz crystal vibrating element 10 is performed. The formation of the excitation electrodes (13a and 13b in FIGS. 1A, 1B, and 1C) is performed by making a film of metal such as gold or chrome along their shapes.

According to the first embodiment described above, in the quartz crystal vibrating element 10, the junction sections 18a and 18b include the groove parts 16a, 16b, and 16c, which are recessed from the both surfaces 23 and 24 of the main vibration section 12 and the both surfaces 21 and 22 of the outer frame section 20, and the flat parts 17a and 17b, which are flush with the foregoing both surfaces 23 and 24 and the both surfaces 21 and 22. Thus, by providing the flat parts 17a and 17b that are flush with the both surfaces 23 and 24 of the main vibration section 12 and the both surfaces 21 and 22 of the outer frame section 20 in the junction sections 18a and 18b, stress concentration caused by an impact or the like can be prevented in portions where the flat parts 17a and 17b are provided. The groove parts 16a, 16b, and 16c in the recessed shape are formed adjoining the flat parts 17a and 17b, thereby enabling the length of the junction sections 18a and 18b to be increased. This further enables the strength of the junction sections 18a and 18b to be increased. Consequently, the junction sections 18a and 18b can be prevented from breakdown due to an impact from the outside or the like.

Moreover, according to the first embodiment, an edge in the X axis direction of the main vibration section 12 described above is formed to be the open edge 14, thereby enabling reduction of the influence of stress caused by the difference in coefficient of thermal expansion between the main vibration section 12 and a cover fixed to the outer frame section 20. Without the open edge 14 in the X axis direction of the main vibration section 12, the frequency-temperature characteristics deteriorate as shown to be substantially linear due to the influence of stress. However, frequency-temperature characteristics indicated by a cubic curve, which are inherent frequency-temperature characteristics of an AT cut quartz crystal vibrating element, can be obtained by forming the open edge 14. Detailed description on this will be given in the following.

The main vibration of a vibrating element having a thickness shear vibration mode is represented by Eq. (5). In Eq. (5), Formula (6) holds in general. When a temperature of the piezoelectric vibrating element varies, the main vibration section and the cover have deformations with different amounts due to the difference in coefficient of thermal expansion between quartz crystal to form the main vibration section and the cover made of a different material fixed to the outer frame connected to the main vibration section. Examples of coefficient of thermal expansion include $19.7 \times 10^{-6}/°$ C. of the X axis of an AT-cut quartz crystal, $12.8 \times 10^{-6}/°$ C. of the Z' axis of an AT-cut quartz crystal, $3.25 \times 10^{-6}/°$ C. of borosilicate glass used for the cover, and the like. The main vibration section is stressed because of the difference in deformation amount. Slight change of constants in Eqs. (5) and Formula (6) affected by the stress causes the frequency change. As a result, frequency characteristics with respect to temperature change, that is, what has been referred to as frequency-temperature characteristics are poor in the quartz crystal vibrating element.

In Eqs. (5) and Formula (6), 2b representing the thickness of the vibrating element, 2a representing the length in the X axis direction of the vibrating element, the elastic constants $C_{66}$ and $C_{11}$, and the density of quartz crystal $\rho$, all are physical constants depending on temperature. Here, the elastic constants $C_{66}$ and $C_{11}$ and the density of quartz crystal $\rho$ are constants inherent to materials, and therefore are not affected by thermal deformation due to the shape of the vibrating element. The thickness of the vibrating element 2b is also not affected by thermal deformation since the vibrating element is open in the thickness direction. Dimension change due to temperature change of 2a representing the length in the X axis direction of the vibrating element causes interference to the outer frame with which the main vibration has a junction, thereby affecting the main vibration. In particular, if both edges in the X axis direction of the main vibration section are connected to the outer frame, interference caused by the dimension change cannot be avoided, thereby significantly affecting the main vibration. Accordingly, by opening at least one edge in the X axis direction of the main vibration section, interference caused by the dimension change due to temperature change can be avoided. This enables prevention of frequency-temperature characteristics from deteriorating.

Equation (5)

$$f_{(1,1,0)} = \frac{1}{2 \cdot 2b}\sqrt{\frac{C_{66}}{\rho}}\left[1 + \frac{1}{2}\frac{C_{11}}{C_{66}}\left(\frac{b}{a}\right)^2\right] \qquad (5)$$

Formula (6)

$$\frac{1}{2}\frac{C_{11}}{C_{66}}\left(\frac{b}{a}\right)^2 \langle\langle 1 \qquad (6)$$

$f_{(1,1,0)}$: main vibration frequency of finite plate, $C_{66}$ and $C_{11}$: elastic constant, $\rho$: density of quartz crystal, 2a: length in the X axis direction of the vibrating element, 2b: thickness of the vibrating element Consequently, according to the quartz crystal vibrating element 10 of the first embodiment, it becomes possible to provide a piezoelectric vibrator that has improved resistance to impact caused by dropping or the like and further can vibrate stably against temperature change.

Second Embodiment

Figure 3A:
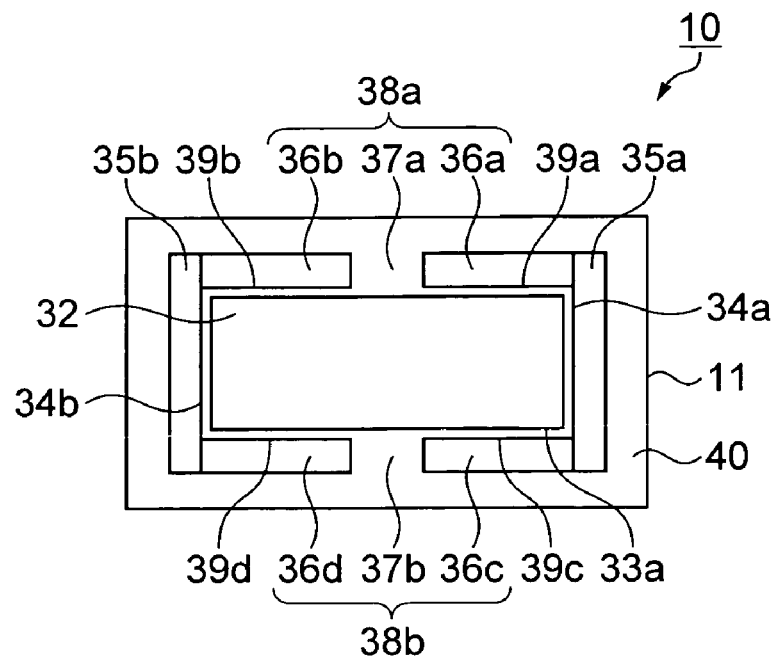
FIGS. 3A and 3B illustrate the schematic structure of a piezoelectric vibrating element of a second embodiment, where
Figure 3B:
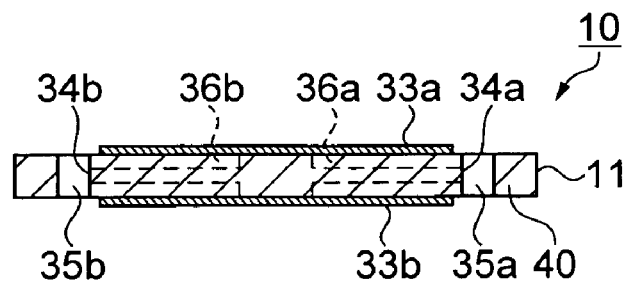

A second embodiment of the piezoelectric vibrating element according to the invention will be described with reference to FIGS. 3A and 3B. FIGS. 3A and 3B illustrate the schematic structure of a piezoelectric vibrating element of the second embodiment, where FIG. 3A is a plan view, and FIG. 3B is a front sectional view. Detailed description on the second embodiment will be given below. However, the outer frame section and propagation of the main vibration are the same as in the first embodiment, and therefore descriptions thereof will not be repeated.

As shown in FIGS. 3A and 3B, a quartz crystal vibrating element 10 as an example of the piezoelectric vibrating element is made from a quartz crystal substrate 11, and includes a main vibration section 32, excitation electrodes 33a and 33b made on the both surfaces of the main vibration section 32, an outer frame section 40 disposed substantially along the outside of the main vibration section 32, and junction sections 38a and 38b connecting the main vibration section 32 with the outer frame section 40.

The main vibration section 32 has a rectangular shape in which its four edges (four sides) are defined by the junction sections 38a and 38b and two through holes 35a and 35b that are disposed in the periphery. In the main vibration section 32, a thickness shear vibration in the X axis direction, which serves as the vibration direction (hereinafter the vibration direction is referred to as the X direction), is excited by applying a voltage to the excitation electrodes 33a and 33b formed on the both surfaces. One edge in the X axis direction of the main vibration section 32 is an open edge 34a made by the through hole 35a. Another edge disposed at the opposite side to the open edge 34a in the X axis direction of the main vibration section 32 is also an open edge 34b made by the through hole 35b in the same manner as the open edge 34a. Edges other than the open edges 34a and 34b of the main vibration section 32 are connected to the junction sections 38a and 38b. Portions of these edges connected to groove parts 36a, 36b, 36c, and 36d include edge surfaces 39a, 39b, 39c, and 39d having depths equivalent to those of recessed shapes of the groove parts 36a, 36b, 36c, and 36d.

The junction sections 38a and 38b include the groove parts 36a, 36b, 36c, and 36d formed in a recessed shape and flat parts 37a and 37b flush with both surfaces of the main vibration section 32 and both surfaces of the outer frame section 40. The flat parts 37a and 37b are provided approximately at the centers of two sides along the X axis direction of the main vibration section 32. The groove parts 36a, 36b, 36c, and 36d have depths of some μm (e.g., 2 μm), and are connected to the flat parts 37a and 37b to extend in the X axis direction of the main vibration section 32. The groove parts 36a, 36b, 36c, and 36d are disposed between the flat parts 37a and 37b and the through holes 35a and 35b.

The quartz crystal vibrating element 10 of the second embodiment can be manufactured by the manufacturing method described in the first embodiment described above.

According to the above-described second embodiment, since the open edges 34a and 34b are provided at both ends of the main vibration section 32, expansion and contraction due to temperature change of the main vibration section 32 and the outer frame section 40 can be absorbed at both ends in the vibration direction. This enables relaxation of the stress applied to the main vibration section 32, thereby further reducing the influence on the vibration characteristics.

Third Embodiment

Figure 4A:
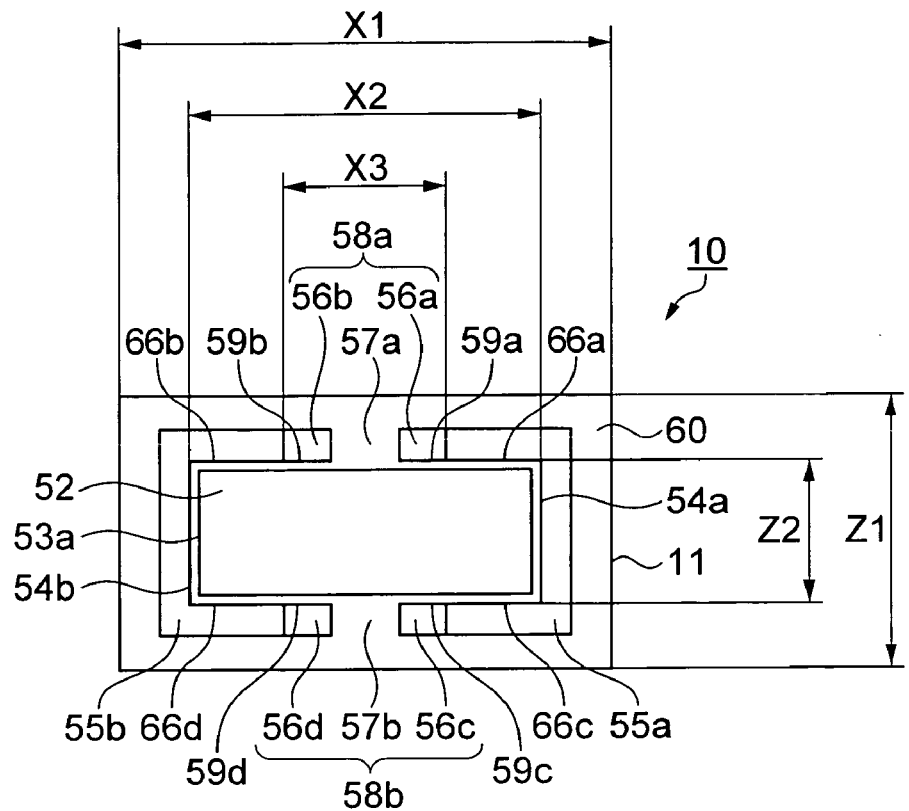
FIGS. 4A and 4B illustrate the schematic structure of a piezoelectric vibrating element of a third embodiment, where
Figure 4B:
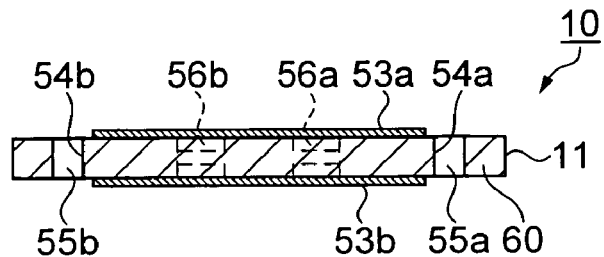

A third embodiment of the piezoelectric vibrating element according to the invention will be described with reference to FIGS. 4A and 4B. FIGS. 4A and 4B illustrate the schematic structure of a piezoelectric vibrating element of the third embodiment, where FIG. 4A is a plan view and FIG. 4B is a front sectional view.

As shown in FIGS. 4A and 4B, the quartz crystal vibrating element 10 as an example of the piezoelectric vibrating element is made from the quartz crystal substrate 11, and includes a main vibration section 52, excitation electrodes 53a and 53b made on both surfaces of the main vibration section 52, an outer frame section 60 disposed substantially along the outside of the main vibration section 52, and junction sections 58a and 58b connecting the main vibration section 52 with the outer frame section 60.

The main vibration section 52 has a rectangular shape in which its four edges (four sides) are defined by the junction sections 58a and 58b and two through holes 55a and 55b that are disposed in the periphery. In the main vibration section 52, a thickness shear vibration that vibrates in the X axis direction, which serves as the vibration direction (hereinafter the vibration direction is referred to as the X direction), is excited by applying a voltage to the excitation electrodes 53a and 53b formed on the both surfaces. Both edges in the X axis direction of the main vibration section 32 are open edges 54a and 54b made by through holes 55a and 55b. While forming the open edges 54a and 54b, the through holes 55a and 55b extend until the ends in the direction substantially perpendicular to the X axis direction (in the width direction of the main vibration section 52, that is, the Z' axis direction) to form what has been referred to as "U-shape". Edges other than the open edges 54a and 54b of the main vibration section 52 consist of portions 59a, 59b, 59c, and 59d connected to the junction sections 58a and 58b and portions 66a, 66b, 66c, and 66d opened by the through holes 55a and 55b. While the above description has illustrated the through holes 55a and 55b extending until the ends in the direction substantially perpendicular to the X axis direction, the through holes 55a and 55b are not limited to this. They may extend until the ends in the direction crossing the X axis direction. For example, if they extend until the ends in the direction obliquely crossing the X axis direction, the same effect is obtained.

The junction sections 58a and 58b include groove parts 56a, 56b, 56c, and 56d that are formed in a recessed shape and flat parts 57a and 57b that are flush with both surfaces of the main vibration section 52 and both surfaces of the outer frame section 60. The flat parts 57a and 57b are provided approximately at the centers of two sides along the X axis direction of the main vibration section 52. The groove parts 56a, 56b, 56c, and 56d have depths of some μm (e.g., 2 μm), and are connected to the flat parts 57a and 57b to extend in the X axis direction of the main vibration section 52. The length X3 in the X axis direction of the junction sections 58a and 58b is set to be equal to or greater than one-half the length X2 in the X axis direction of the main vibration section 52.

Figure 5:
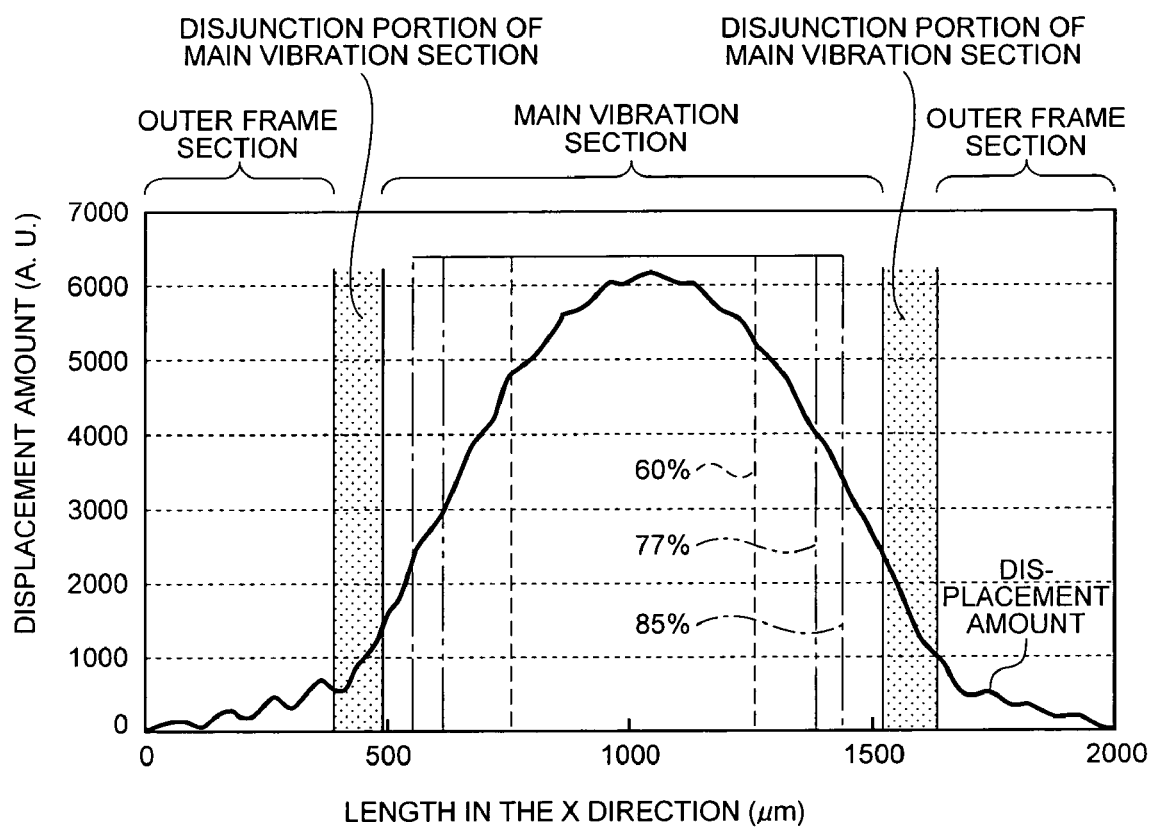
FIG. 5 is a graph illustrating displacement distributions in the X axis direction of a quartz crystal vibrating element in the third embodiment.

The above-mentioned length X3 set to be equal to or greater than one-half the length X2 will now be described with reference to FIG. 5. FIG. 5 is a graph illustrating displacement distribution in the X axis direction of a quartz crystal vibrating element in the third embodiment.

In the quartz crystal vibrating element 10 as shown in FIGS. 4A and 4B, various problems may occur due to the shapes of the junction sections 58a and 58b that make a junction between the main vibration section 52 and the outer frame section 60. For example, if the junction sections 58a and 58b have small widths and thicknesses and therefore have low strength, the impact resistance of the junction sections 58a and 58b is poor and therefore the junction sections 58a and 58b may be broken by a shock from the outside. In another example, spurious vibration mode for the main vibration in the main vibration section 52 sometimes occurs to cause deterioration of the vibration characteristics. Detailed description on a spurious vibration mode is given. In a contour vibration mode caused by the width Z2 in the Z' direction of the main vibration section 52 (the width direction, which is orthogonal to the vibration direction, of the main vibration section), the narrower the width of the main vibration section is, the more closely a lower order vibration approaches the main vibration. The contour vibration mode is a spurious vibration mode. In the contour vibration mode, a lower order vibration has larger strength than a higher order vibration, and therefore is liable to affect the main vibration. For this reason, when the quartz crystal vibrating element 10 is formed, the width Z1 of the quartz crystal vibrating element 10 is made as large as possible in the effective area of the vibration in the quartz crystal vibrating element 10 so that a higher order vibration in the contour vibration mode is near the main vibration, making it difficult for the main vibration to be affected by the contour vibration mode. For this purpose, the width of the junction section X3 is increased in order to increase the width Z1 of the quartz crystal vibrating element 10 in the effective area of the vibration.

The displacement distribution of the thickness shear vibration, which is the main vibration, is as shown by the broken line in FIG. 5. FIG. 5 illustrates exemplary displacement distributions of the thickness shear vibration with the length in the X direction of the quartz crystal vibrating element 10

(X1 shown in FIGS. 4A and 4B) of 2000 μm and the length of the main vibration section disposed in the center portion (X2 shown in FIGS. 4A and 4B) of 1100 μm. In this case, the ratio of the accumulated displacement amount in an area of 80% of the length of the main vibration section (an area indicated by the alternate long and short dash line in FIG. 5) to the total displacement amount is 85%. Similarly, the ratio of the accumulated displacement amount in an area of 70% of the length of the main vibration section (an area indicated by the chain double-dashed line in FIG. 5) to the total displacement amount is 77%, and the ratio of the accumulated displacement amount in an area of 50% of the length of the main vibration section (an area indicated by the broken line in FIG. 5) to the total displacement amount is 60%. The larger the value of the ratio of the accumulated displacement amount to the total displacement amount is, the larger the effective area of the main vibration is, thereby improving vibration characteristics. Therefore, the width of the junction section X3 is made equal to or greater than 50% (one-half) of the length of the main vibration section so that the ratio of the accumulated displacement amount to the total displacement amount is at least equal to or greater than 60%, thereby enabling good vibration characteristics to be ensured. As a result, reduction of the influence on vibration characteristics is enabled.

In addition, it is possible to manufacture the quartz crystal vibrating element in the third embodiment by the manufacturing method described in the above first embodiment.

According to the above third embodiment, the width of the main vibration section 52 in the area of one-half the length of the main vibration section 52 or more is increased. The increase in the width of the main vibration section 52 causes a higher order vibration in the contour vibration mode, which is a spurious vibration mode, to be near the main vibration. This allows the influence of the contour vibration mode on the main vibration to be reduced and the stable vibration characteristics to be obtained, and as a result, it becomes possible to provide a piezoelectric vibrator having stable vibration characteristics.

While the above description on the manufacturing method of the quartz crystal vibrating element 10 in the first to third embodiments has illustrated the process method of the quartz crystal vibrating element 10 by using the blast processing, the process method of the quartz crystal vibrating element 10 is not limited to the blast processing. For example, it is possible to form a mask pattern of a material that can withstand chemical etching and to etch the quartz crystal substrate 11 by a chemical etching process.

Fourth Embodiment

Figure 6A:
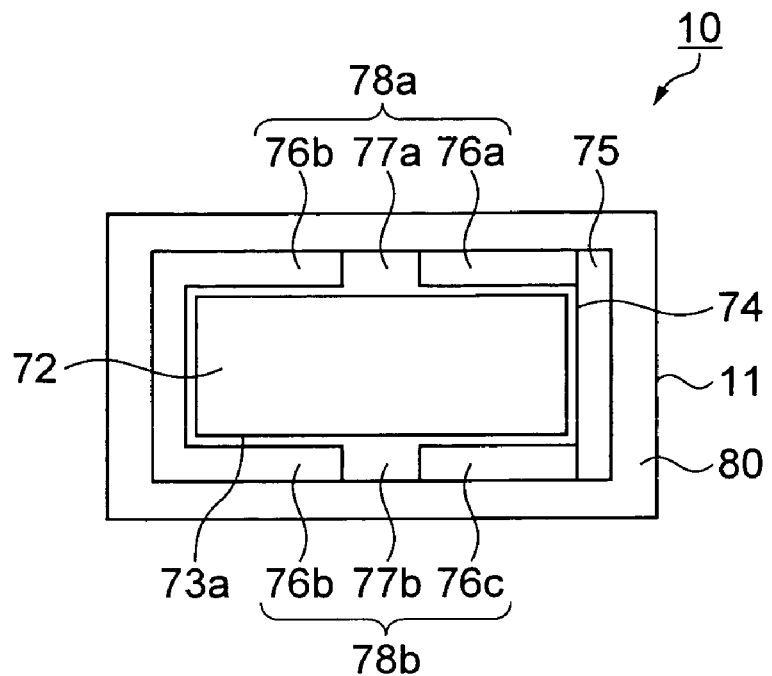
FIGS. 6A and 6B illustrate the schematic structure of a piezoelectric vibrating element of a fourth embodiment, where
Figure 6B:
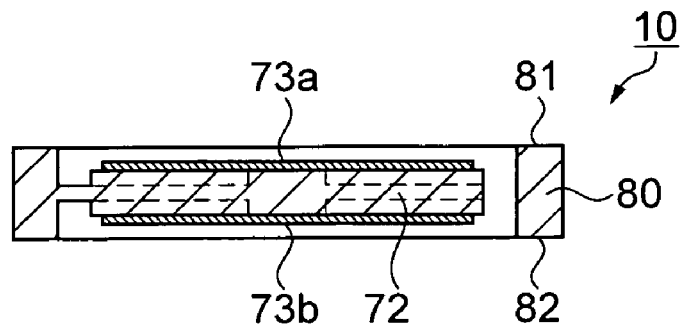

The fourth embodiment of a piezoelectric vibrating element according to the invention will be described with reference to FIGS. 6A and 6B. FIGS. 6A and 6B illustrate the schematic structure of a piezoelectric vibrating element of the fourth embodiment, where FIG. 6A is a plan view and FIG. 6B is a front sectional view.

As shown in FIGS. 6A and 6B, the quartz crystal vibrating element 10 as an example of the piezoelectric vibrating element is made from a quartz crystal substrate 11. The quartz crystal vibrating element 10 includes a main vibration section 72, excitation electrodes 73a and 73b made on both surfaces of the main vibration section 72, an outer frame section 80 disposed substantially along the outside of the main vibration section 72, and junction sections 78a and 78b connecting the main vibration section 72 with the outer frame section 80.

The main vibration section 72 has a rectangular shape in which its four edges (four sides) are defined by the junction sections 78a and 78b and a through hole 75 that are disposed in the periphery. One edge disposed in the X axis direction of the main vibration section 72 is an open edge 74 made by the through hole 75. The other edges of the main vibration section 72 are connected to the junction sections 78a and 78b.

The junction sections 78a and 78b include groove parts 76a, 76b, and 76c that are formed in a recessed shape at the both surfaces of the main vibration section 72 and flat parts 77a and 77b that are flush with the both surfaces of the main vibration section 72. Other components in the structure of the junction sections 78a and 78b and the groove parts 76a, 76b, and 76c are the same as in the first embodiment, and the same explanation will not be repeated.

In the outer frame section 80, the quartz crystal vibrating element 10 is connected with a holder of another circuit board or the like (not shown) or with a cover (not shown) to protect the main vibration section 72. The outer frame section 80 is formed to have its both surfaces 81 and 82 positioned outside the components other than the outer frame section 80 constituting the quartz crystal vibrating element 10 in the thickness direction (positioned in the opposite direction to the center). The outer frame section 80 and the main vibration section 72 are integrally connected with each other through the junction sections 78a and 78b in the quartz crystal substrate 11.

Figure 7:
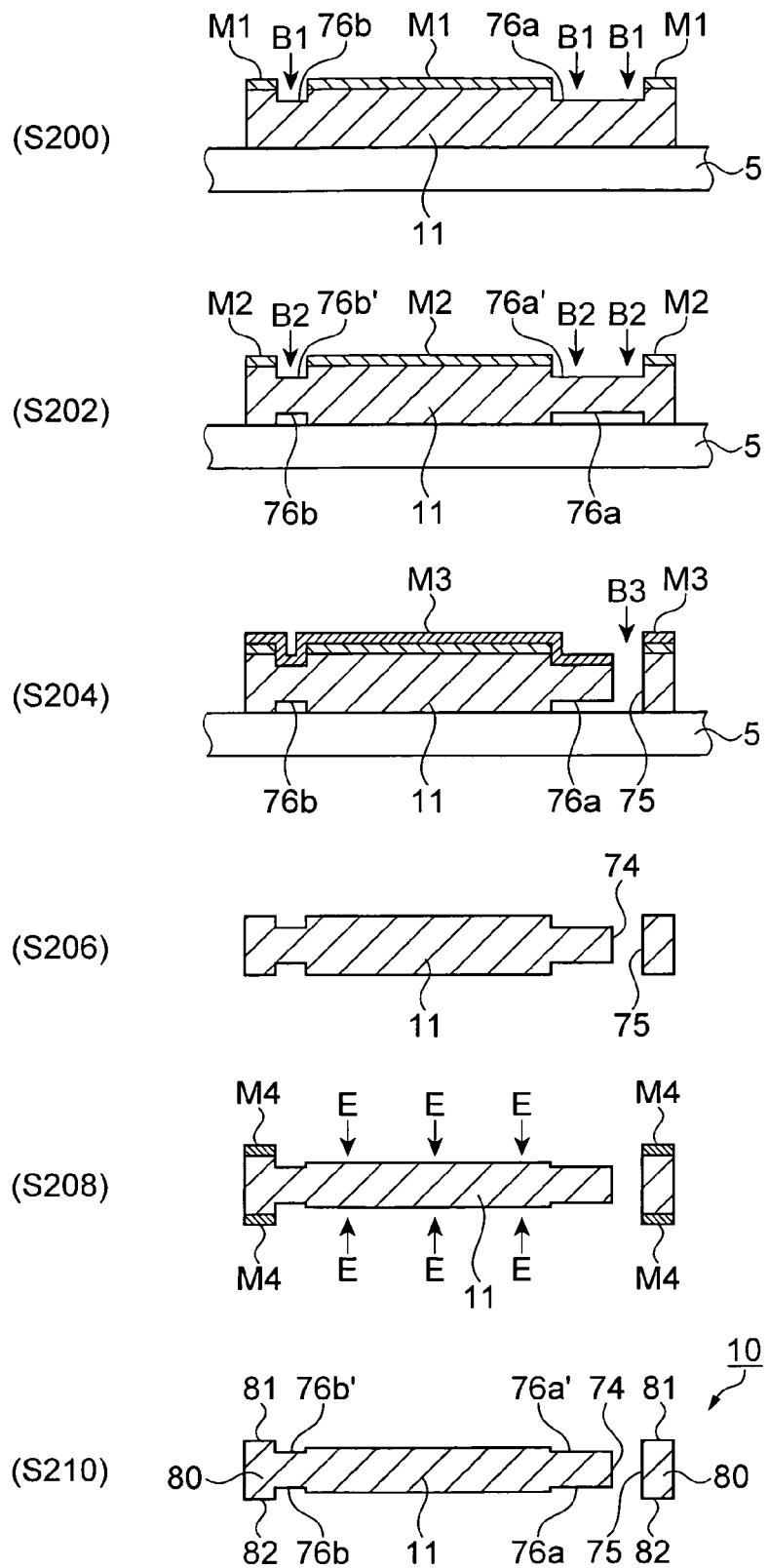
FIG. 7 is a process flow diagram for illustrating a manufacturing method of a quartz crystal vibrating element of the fourth embodiment.

A method of manufacturing the quartz crystal vibrating element 10 of the fourth embodiment will next be described with reference to FIG. 7. FIG. 7 is a process flow diagram for illustrating a manufacturing method of a quartz crystal vibrating element 10 of the fourth embodiment.

A first mask pattern M1 corresponding to the shape of the quartz crystal vibrating element 10 is initially formed on the front surface of the quartz crystal substrate 11 (quartz crystal wafer) used as an example of the piezoelectric substrate. Mask patterns that can withstand blast processing to be described later are sufficient for the first mask pattern M1. For example, a dry film resist is only needed to be attached onto the quartz crystal substrate 11 and then exposed and developed in correspondence to the shape of the quartz crystal vibrating element 10, thereby forming the first mask pattern M1 on a portion of the dry film resist that corresponds to the shape of the quartz crystal vibrating element 10. Depending on embodiments, a photoresist may be applied onto the quartz crystal substrate 11 and then exposed and developed in correspondence to the shape of the quartz crystal vibrating element 10, thereby forming the first mask pattern M1 on a portion of the photoresist that corresponds to the shape of the quartz crystal vibrating element 10. A film made of metal or the like in correspondence to the shape of the quartz crystal vibrating element 10 may also be used as the first mask pattern M1. The quartz crystal substrate 11 having the first mask pattern M1 formed thereon is fixed to a table 5 with the front surface facing upward. As indicated by arrow B1, an abrasive as well as pressurized gas are blasted from a blast device (not shown) to the quartz crystal substrate 11 to halfway remove portions of the quartz crystal substrate 11 on which the first mask pattern M1 is not formed, and thereby the groove parts 76a and 76b in the recessed shape are formed (S200). Openings of the groove parts 76a and 76b are not limited to ones having the sides perpendicular to the front surface of the quartz crystal substrate 11, and may have a tapered shape that is wide at the front surface side and is narrow at the center side of the quartz crystal substrate 11.

After the first mask pattern M1 is removed, a second mask pattern M2 is formed on the back surface of the quartz crystal substrate 11. The second mask pattern M2 is provided on the back surface of the quartz crystal substrate 11 in correspondence to the shape of the quartz crystal vibrating element 10, and is only needed to be formed in the same manner as the first mask pattern M1. The quartz crystal substrate 11 having the second mask pattern M2 formed thereon is fixed to the table 5 with the back surface facing upward. As indicated by arrow B2, an abrasive as well as pressurized gas are blasted from a blast device (not shown) to the quartz crystal substrate 11 to halfway remove portions of the quartz crystal substrate 11 on which the second mask pattern M2 is not formed, and thereby the groove parts 76a' and 76b' in the recessed shape are formed (S202).

The through hole 75 is next formed. The through hole 75 is provided so as to form an open edge of the main vibration section of the quartz crystal vibrating element 10. A third mask pattern M3 excluding a portion corresponding to the through hole 75 is formed on the second mask pattern M2 at the back surface of the quartz crystal substrate 11 and on a crystal surface of the exposed groove parts 76a' and 76b'. The third mask pattern M3 is formed on the surface of the second mask pattern M2 without removing the second mask pattern M2 in this example, but may be formed on the exposed crystal surface at the back surface of the quartz crystal substrate 11 after the second mask pattern M2 is removed. The quartz crystal substrate 11 having the third mask pattern M3 formed thereon is fixed to the table 5 with the third mask pattern M3 facing upward. As indicated by arrow B3, an abrasive as well as pressurized gas are blasted from a blast device (not shown) to the quartz crystal substrate 11 to remove a portion without the third mask pattern M3 of the quartz crystal substrate 11 so that a hole passes completely through to the groove 16a' explained in step S200, and thereby the through hole 75 is formed (S204).

The quartz crystal substrate 11 is then detached from the fixing plate 5, and the third mask pattern M3 and the second mask pattern M2 are removed (S206). Thus, the junction section (shown by 78a and 78b in FIG. 6A) including groove parts 76a, 76b, 76a', and 76b' and other parts, the main vibration section (shown by 72 in FIGS. 6A and 6B), and the outer frame section (shown by 80 in FIGS. 6A and 6B) are formed in the quartz crystal substrate 11.

Fourth mask patterns M4 are formed on a portion excluding the main vibration section (72 in FIGS. 6A and 6B) and the junction sections (78a and 78b in FIG. 6A) of the quartz crystal substrate 11 after completion of the process in step S206. The substrate is then immersed in an etching liquid, and the chemical etching is performed for the main vibration section (72 in FIGS. 6A and 6B) and the junction sections (78a and 78b in FIG. 6A) (S208). The thickness of the main vibration section (72 in FIGS. 6A and 6B) and the junction sections (78a and 78b in FIG. 6A) are reduced at the both surfaces by the chemical etching, for example as shown by E in FIG. 7. This allows the outer frame section (80 in FIGS. 6A and 6B) to have its both surfaces positioned outside the main vibration section (72 in FIGS. 6A and 6B) and the junction sections (78a and 78b in FIG. 6A) in the thickness direction (positioned in the opposite direction to the center). In addition, the fourth mask patterns M4 are illustrated on the both surfaces of the outer frame section (80 in FIGS. 6A and 6B) in FIG. 7, but are formed on all portions where chemical etching is unnecessary.

The fourth mask patterns are then removed (S210). Thus, the quartz crystal vibrating element 10 that includes the junction sections 78a and 78b including the groove parts 76a, 76b, 76a', and 76b' and the flat parts (77a and 77b in FIG. 6A), the main vibration section (72 in FIGS. 6A and 6B) substantially surrounded by the through hole 75, and the outer frame section 80 provided in the quartz crystal substrate 11 is formed.

Thereafter, although not shown in FIG. 7, formation of electrodes such as the excitation electrodes (73a and 73b in FIG. 6B) formed on the both surfaces of the main vibration section of the quartz crystal vibrating element 10 is performed. The formation of the excitation electrodes (73a and 73b in FIG. 6B) is performed by making a film of metal such as gold or chrome along their shapes.

According to the fourth embodiment described above, the outer frame section 80 is formed to have its both surfaces 81 and 82 positioned outside the components other than the outer frame section 80 in the thickness direction (positioned in the opposite direction to the center). Therefore, even though the outer frame section 80 is connected with holders of another circuit board and the like or a cover to protect the main vibration section 72 is fixed to the outer frame section 80, it is possible to prevent these holders, cover, and the like from coming contact with the quartz crystal vibrating element 10. Prevention of the contact enables vibration with stable and good characteristics to be continued.

While the above description on the manufacturing method of the quartz crystal vibrating element 10 has illustrated the process method of the quartz crystal vibrating element 10 using the blast processing in the process steps S200 to S204, the process method is not limited to the blast processing. For example, it is possible to form a mask pattern of a material that can withstand chemical etching and to etch the quartz crystal substrate 11 by a chemical etching process.

In addition, while the above description in the first to fourth embodiments has illustrated the shapes of the through-holes and junction sections using symmetric shapes about the center of the main vibration section as an example, their shapes are not needed be symmetric and different shapes may be formed for different edges.

Fifth Embodiment

Figure 8:
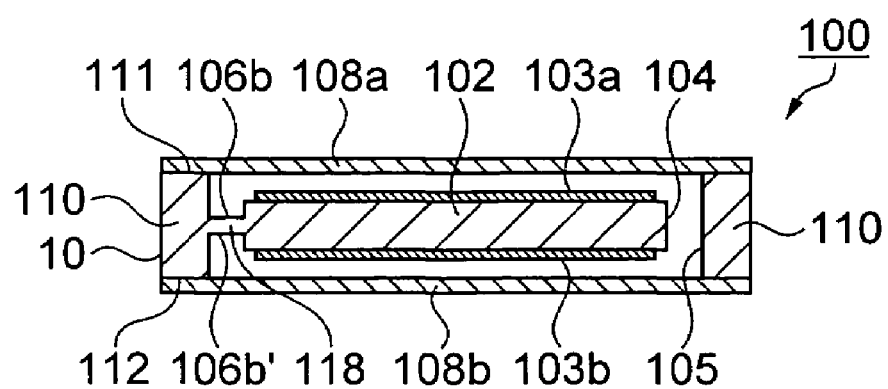
FIG. 8 is a front sectional view illustrating the schematic structure of a quartz crystal vibrator of a fifth embodiment.

A quartz crystal vibrator as an example of a piezoelectric vibrator according to an embodiment of the invention will now be described as the fifth embodiment with reference to FIG. 8. FIG. 8 is a front sectional view illustrating the schematic structure of a quartz crystal vibrator of the fifth embodiment.

As shown in FIG. 8, a quartz crystal vibrator 100 as an example of a piezoelectric vibrator according to the invention includes the quartz crystal vibrating element 10 described in the above fourth embodiment and covers 108a and 108b fixed to both surfaces 111 and 112 of an outer frame section 110 of the quartz crystal vibrating element 10.

The quartz crystal vibrating element 10 includes a main vibration section 102, excitation electrodes 103a and 103b made on both surfaces of the main vibration section 102, an outer frame section 110 disposed substantially along the outside of the main vibration section 102, and junction sections 118 connecting the main vibration section 102 with the outer frame section 110.

The main vibration section 102 has a rectangular shape in which its four edges (four sides) are defined by the junction sections 118 and a through hole 105 that are disposed in the periphery. At least one edge disposed in the X axis direction, which is the vibration direction of the main vibration section 102, is an open edge 104 made by the through hole 105. The other edges of the main vibration section 102 are connected to the junction sections 118 including groove parts 106b and 106b' and flat parts (not shown).

The outer frame section 110 is formed to have its both surfaces 111 and 112 positioned outside the components other than the outer frame section 110 constituting the quartz crystal vibrating element 10 in the thickness direction (positioned in the opposite direction to the center). The outer frame section 110 and the main vibration section 102 are integrally connected with each other through the junction sections 118.

The covers 108a and 108b use borosilicate glass plates. The covers 108a and 108b are airtightly fixed to the both surfaces 111 and 112 on the outer frame section 110 of the quartz crystal vibrating element 10 by using, for example, anodic bonding or the like. Since the both surfaces 111 and 112 of the outer frame section 110 are disposed outside other surfaces in the thickness direction, the covers 108a and 108b can be prevented from coming contact with the main vibration section 102 and junction sections 118.

According to the fifth embodiment, a quartz crystal vibrating element having less deterioration in vibration characteristics with temperature change is airtightly contained, and therefore a quartz crystal vibrator capable of continuing stable vibration characteristics can be provided. Moreover, the covers 108a and 108b are fixed to the outer frame section 110 that is formed integrally with the main vibration section 102 constituting the quartz crystal vibrating element 10. Therefore, the same area can serve as the fixing area of a quartz crystal vibrating element and as the bonding area for covers, enabling reduction of the fixing space. Accordingly, it becomes possible to provide a small-sized quartz crystal vibrator in which deterioration in vibration characteristics with temperature change is prevented.

Sixth Embodiment

Figure 9:
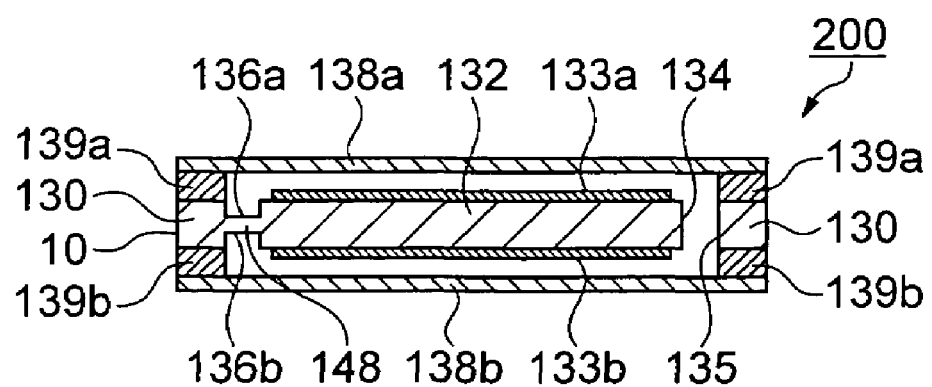
FIG. 9 is a front sectional view illustrating the schematic structure of a quartz crystal vibrator of a sixth embodiment.
Figure 10A:
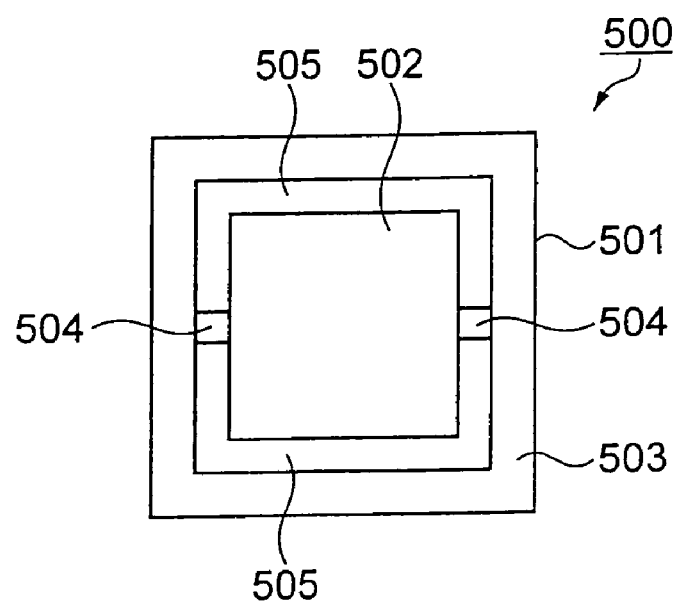
FIGS. 10A and 10B illustrate an AT cut vibrating element using a quartz crystal substrate as an example of the related art piezoelectric vibrating elements, where
Figure 10B:
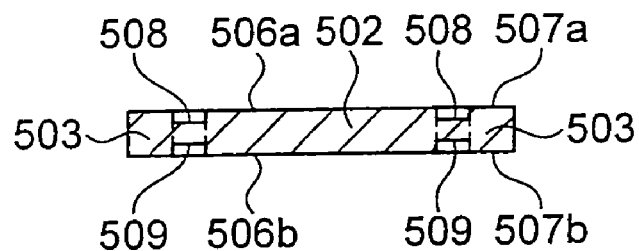

A quartz crystal vibrator as an example of a piezoelectric vibrator according to an embodiment of the invention will now be described as the sixth embodiment with reference to FIG. 9. FIG. 9 is a front sectional view illustrating the schematic structure of a quartz crystal vibrator of the sixth embodiment.

As shown in FIG. 9, a quartz crystal vibrator 200 as an example of a piezoelectric vibrator according to the invention includes the quartz crystal vibrating element 10 described in the above first to third embodiments and covers 138a and 138b fixed through frames to both surfaces of an outer frame section 130 of the quartz crystal vibrating element 10.

The quartz crystal vibrating element 10 includes a main vibration section 132, excitation electrodes 133a and 133b made on the both surfaces of the main vibration section 132, the outer frame section 130 disposed substantially along the outside of the main vibration section 132, and junction sections 148 connecting the main vibration section 132 with the outer frame section 130.

The main vibration section 132 has a rectangular shape in which its four edges (four sides) are defined by the junction sections 148 and a through hole 135 that are disposed in the periphery. At least one edge disposed in the X axis direction, which is the vibration direction of the main vibration section 132, is an open edge 134 made by the through hole 135. The other edges of the main vibration section 132 are connected to the junction sections 148 including groove parts 136a and 136b and flat parts (not shown).

The covers 138a and 138b use borosilicate glass plates. The covers 138a and 138b are airtightly fixed through frames 139a and 139b to both surfaces of the outer frame section 130. The frames 139a and 139b function as spacers with which the covers 138a and 138b never come in contact with the main vibration section 132, the junction sections 148, and the like, and are formed to have a frame shape substantially along the outer frame section 130 with a substantially constant thickness. For example, metal rings, glass rings, a thermosetting adhesive applied in a frame shape with a constant thickness, and the like can be used for the frames 139a and 139b.

According to the sixth embodiment, the quartz crystal vibrating element 10 having less deterioration in vibration characteristics with temperature change is airtightly contained, and therefore the quartz crystal vibrator 200 capable of continuing stable vibration characteristics can be provided. Moreover, the covers 138a and 138b are fixed through the frames 139a and 139b to the outer frame section 130 that is formed integrally with the main vibration section 132 constituting the quartz crystal vibrating element 10. By using the frames 139a and 139b, it becomes unnecessary to make the thickness of the outer frame section 130 larger than that of other portions, and manufacturing processes of the quartz crystal vibrating element 10 can be reduced. In addition, the same area can serve as the fixing area of the quartz crystal vibrating element 10 and as the bonding area for the covers 138a and 138b, enabling reduction of the fixing space. Accordingly, the sixth embodiment enables provision of a small-sized quartz crystal vibrator having stable vibration characteristics against temperature change at low cost.

In addition, the fixing method of both surfaces of the outer frame section with covers, which has been described in the fifth and sixth embodiments, may use other fixing materials such as low-melting glass and thermosetting adhesives.

The entire disclosure of Japanese Patent Application No. 2005-052591, filed Feb. 28, 2005 is expressly incorporated by reference herein.

What is claimed is:

1. A piezoelectric vibrating element, comprising:
   a main vibration section vibrating in a constant direction:
   an open edge formed at least at one edge among a plurality of edges provided in a vibration direction of the main vibration section;
   an outer frame section formed so as to surround the main vibration section; and
   a junction section being disposed between the main vibration section and the outer frame section, the junction section excluding the open edge, and the junction section being formed so as to integrally connect the main vibration section with the outer frame section, the junction section including:
   (1) a first groove part being recessed with respect to a first surface of the main vibration section, and a second groove part being recessed with respect to a second surface of the main vibration section,
   (2) an area between the first groove part and the second groove part being integrally connected to the main vibration section and the outer frame section, and
   (3) a flat part being substantially flush with both surfaces of the main vibration section.

2. The piezoelectric vibrating element according to claim 1, the open edge being formed at both ends of the main vibration section in the main vibrating direction.

3. The piezoelectric vibrating element according to claim 1, the open edge extending to part of an edge of the main vibration section in a direction crossing the vibration direction of the main vibration section.

4. The piezoelectric vibrating element according to claim 1, the junction section being formed to have a length equal to or greater than one-half of the length in the vibration direction of the main vibration section.

5. The piezoelectric vibrating element according to claim 1, both surfaces of the outer frame section being formed outside of both surfaces of the main vibration section, in a thickness direction.

6. A piezoelectric vibrator, comprising:

a main vibration section vibrating in a constant direction;

an open edge formed at least at one edge in a vibration direction of the main vibration section;

an outer frame section formed so as to surround the main vibration section;

a junction section being disposed between the main vibration section and the outer frame section, the junction section excluding the open edge, the junction section being formed so as to integrally connect the main vibration section with the outer frame section, the junction section including:

(1) a first groove part being recessed with respect to a first surface of the main vibration section, and a second groove part being recessed with respect to a second surface of the main vibration section, (2) an area between the first groove part and the second groove part being integrally connected to the main vibration section and the outer frame section, and (3) a flat part being substantially flush with both surfaces of the main vibration section; and a cover containing at least the main vibration section and being fixed to the outer frame section.

7. The piezoelectric vibrator according to claim 6, the open edge being formed at both ends of the main vibration section in the main vibrating direction.

8. The piezoelectric vibrator according to claim 6, the open edge extending to part of an edge of the main vibration section in a direction crossing the vibration direction of the main vibration section.

9. The piezoelectric vibrator according to claim 6, the junction section being formed to have a length equal to or greater than one-half of the length in the vibration direction of the main vibration section.

10. The piezoelectric vibrator according to claim 6, both surfaces of the outer frame section being formed outside of both surfaces of the main vibration section, in a thickness direction.

11. The piezoelectric vibrator according to claim 6, the cover being fixed through a frame formed in a constant thickness substantially along the outer frame section to the outer frame section.

* * * * *